United States Patent
Salas

(10) Patent No.: US 10,001,526 B2
(45) Date of Patent: Jun. 19, 2018

(54) SELF-TESTING GROUND FAULT CIRCUIT INTERRUPTER

(71) Applicant: COOPER TECHNOLOGIES COMPANY, Houston, TX (US)

(72) Inventor: Luis F. Salas, Fayetteville, GA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 363 days.

(21) Appl. No.: 14/807,136

(22) Filed: Jul. 23, 2015

(65) Prior Publication Data

US 2016/0109521 A1    Apr. 21, 2016

Related U.S. Application Data

(60) Provisional application No. 62/065,194, filed on Oct. 17, 2014.

(51) Int. Cl.
G01R 31/02 (2006.01)
G01R 31/327 (2006.01)
H02H 3/33 (2006.01)

(52) U.S. Cl.
CPC .......... *G01R 31/327* (2013.01); *H02H 3/335* (2013.01)

(58) Field of Classification Search
None
See application file for complete search history.

(56) References Cited

U.S. PATENT DOCUMENTS

| | | | |
|---|---|---|---|
| 4,816,957 A | 3/1989 | Irwin | |
| 5,083,232 A * | 1/1992 | Bergsjo | H02H 9/023 361/11 |
| 5,600,524 A | 2/1997 | Neiger et al. | |
| 5,715,125 A | 2/1998 | Neiger et al. | |
| 6,111,733 A | 8/2000 | Neiger et al. | |
| 6,262,871 B1 | 7/2001 | Nemir et al. | |
| 6,370,001 B1 | 4/2002 | Macbeth | |
| 6,421,214 B1 | 7/2002 | Packard et al. | |
| 6,674,289 B2 | 1/2004 | Macbeth | |
| 6,807,035 B1 | 10/2004 | Baldwin et al. | |
| 6,807,036 B2 | 10/2004 | Baldwin | |
| 6,873,158 B2 | 3/2005 | Macbeth | |

(Continued)

FOREIGN PATENT DOCUMENTS

CN    102005934 A  *  4/2011

OTHER PUBLICATIONS

Fang et al, "Reconfigurable power inverter for direct drive type permanent-magnet synchronous generating system". CN 102005934 A. (English Machine Translation, Published Apr. 6, 2011).*

(Continued)

*Primary Examiner* — Vincent Q Nguyen
(74) *Attorney, Agent, or Firm* — Eckert Seamans

(57) ABSTRACT

A circuit interrupter including a ground fault circuit interrupter circuit structured to detect a ground fault based on current flowing in line and neutral conductors of the circuit interrupter, a ground fault circuit interrupter monitor circuit structured to perform a self-test on the circuit interrupter to determine the functional status of the ground fault circuit interrupter, and a bridge circuit structured to harvest power from the line and neutral conductors and supply said harvested power to the ground fault circuit interrupter circuit and the ground fault circuit interrupter monitor circuit.

13 Claims, 3 Drawing Sheets

(56) References Cited

U.S. PATENT DOCUMENTS

| | | |
|---|---|---|
| 6,980,005 B2 | 12/2005 | Finlay, Sr. et al. |
| 7,068,481 B2 | 6/2006 | Radosavljevic et al. |
| 7,149,065 B2 | 12/2006 | Baldwin et al. |
| 7,253,629 B1 | 8/2007 | Richards et al. |
| 7,295,415 B2 | 11/2007 | Huang et al. |
| 7,315,437 B2 | 1/2008 | Bonilla et al. |
| 7,428,132 B1 | 9/2008 | Radosavljevic et al. |
| 7,443,309 B2 | 10/2008 | Baldwin et al. |
| 7,576,960 B2 | 8/2009 | Gao et al. |
| 7,586,718 B1 | 9/2009 | Radosavljevic et al. |
| 7,733,617 B2 | 6/2010 | Baldwin et al. |
| 7,751,160 B1 | 7/2010 | Radosavljevic et al. |
| 7,791,848 B2 | 9/2010 | Baldwin et al. |
| 7,800,873 B2 | 9/2010 | Batko et al. |
| 7,800,874 B2 | 9/2010 | DiSalvo et al. |
| 7,843,197 B2 | 11/2010 | Finlay, Sr. et al. |
| 7,911,746 B2 | 3/2011 | Zaretsky et al. |
| 8,085,516 B1 | 12/2011 | Armstrong |
| 8,125,228 B2 | 2/2012 | Richards et al. |
| 8,159,794 B2 | 4/2012 | Baldwin et al. |
| 8,513,964 B2 | 8/2013 | Yue et al. |
| 8,526,144 B2 | 9/2013 | Kevelos et al. |
| 8,547,126 B2 | 10/2013 | Ostrovsky et al. |
| 8,570,181 B2 | 10/2013 | Kinsel et al. |
| 8,760,824 B2 | 6/2014 | Armstrong |
| 8,810,979 B2 | 8/2014 | Kinsel et al. |
| 2007/0279814 A1 | 12/2007 | Bonilla et al. |
| 2011/0222194 A1 | 9/2011 | Kinsel et al. |
| 2013/0242440 A1 | 9/2013 | Bonasia et al. |
| 2014/0092503 A1 | 4/2014 | Ostrovsky |
| 2014/0293490 A1 | 10/2014 | Armstrong |

OTHER PUBLICATIONS

European Patent Office "International Search Report and Written Opinion for PCT/US2015/046466", Oct. 29, 2015, 9 pp.

* cited by examiner

SELF-TESTING GROUND FAULT CIRCUIT INTERRUPTER

CROSS-REFERENCE TO RELATED APPLICATIONS

This application claims priority from and claims the benefit of U.S. Provisional Patent Application Ser. No. 62/065,194, filed Oct. 17, 2014, which is incorporated by reference herein.

BACKGROUND

Field

The disclosed concept relates generally to circuit interrupters, and in particular, to self-testing circuit interrupters.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit breakers typically include separable contacts. The separable contacts may be operated either manually by way of an operator handle or automatically in response to a detected fault condition. Typically, such circuit breakers include an operating mechanism, which is designed to rapidly open the separable contacts, and a trip mechanism, such as a trip unit, which senses a number of fault conditions to trip the breaker automatically. Upon sensing a fault condition, the trip unit trips the operating mechanism to a trip state, which moves the separable contacts to their open position.

An existing ground fault circuit interrupter (GFCI) circuit 100 is shown in FIG. 1. The GFCI circuit 100 is structured to detect a ground fault on a protected circuit and trip open separable contacts 102 in response to the detected ground fault. An existing GFCI monitor circuit 110 is shown in FIG. 2. The GFCI monitor circuit 110 is structured to monitor the functional status of a GFCI circuit by performing a self-test on a circuit interrupter. However, the GFCI circuit of FIG. 1 and the GFCI monitor circuit of FIG. 2 have not previously been used together in a circuit interrupter.

Furthermore, UL943 includes a self-test requirement, effective on Jun. 29, 2015. The GFCI circuit of FIG. 1 does not comply with UL943 because it does not have a self-test capability.

The GFCI circuit 100 of FIG. 1 and the GFCI monitor circuit 110 of FIG. 2 both require power to operate. The GFCI circuit 100 of FIG. 1 includes a standard bridge rectifier 104. However, if any of the diodes fail in the bridge rectifier, the power to the GFCI circuit 100 would be compromised. A power supply is not shown for the GFCI monitor circuit 110 of FIG. 2, but if a standard bridge rectifier were used to provide power to the GFCI monitor circuit 110 of FIG. 2, a diode failure could compromise the power to the GFCI monitor circuit 110 of FIG. 2. If a GFCI circuit or a GFCI monitor circuit loses power, it becomes ineffective. Reliable power is therefore desirable for GFCI circuits and GFCI monitor circuits.

There is therefore a room for improvement in circuit interrupters.

SUMMARY

These needs and others are met by embodiments of the disclosed concept in which a circuit interrupter includes a GFCI circuit, a GFCI monitor circuit, and a bridge circuit structured to provide power to the GFCI circuit and the GFCI monitor circuit.

In accordance with one aspect of the disclosed concept, a circuit interrupter comprises: a ground fault circuit interrupter circuit structured to detect a ground fault based on current flowing in line and neutral conductors of the circuit interrupter; a ground fault circuit interrupter monitor circuit structured to perform a self-test on the circuit interrupter to determine the functional status of the ground fault circuit interrupter; and a bridge circuit structured to harvest power from the line and neutral conductors and supply said harvested power to the ground fault circuit interrupter circuit and the ground fault circuit interrupter monitor circuit.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
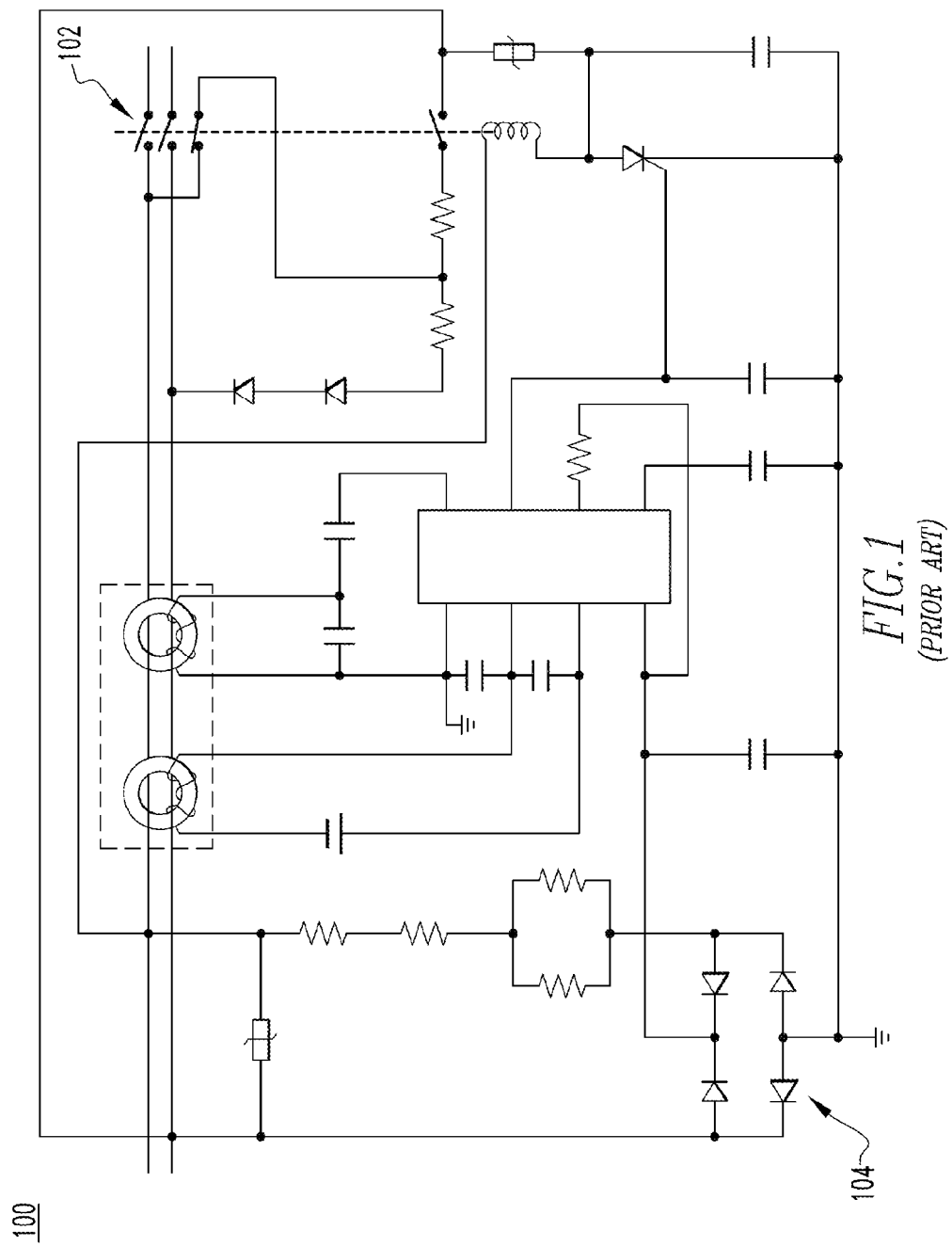
FIG. 1 is a circuit diagram of a GFCI circuit.
Figure 2:
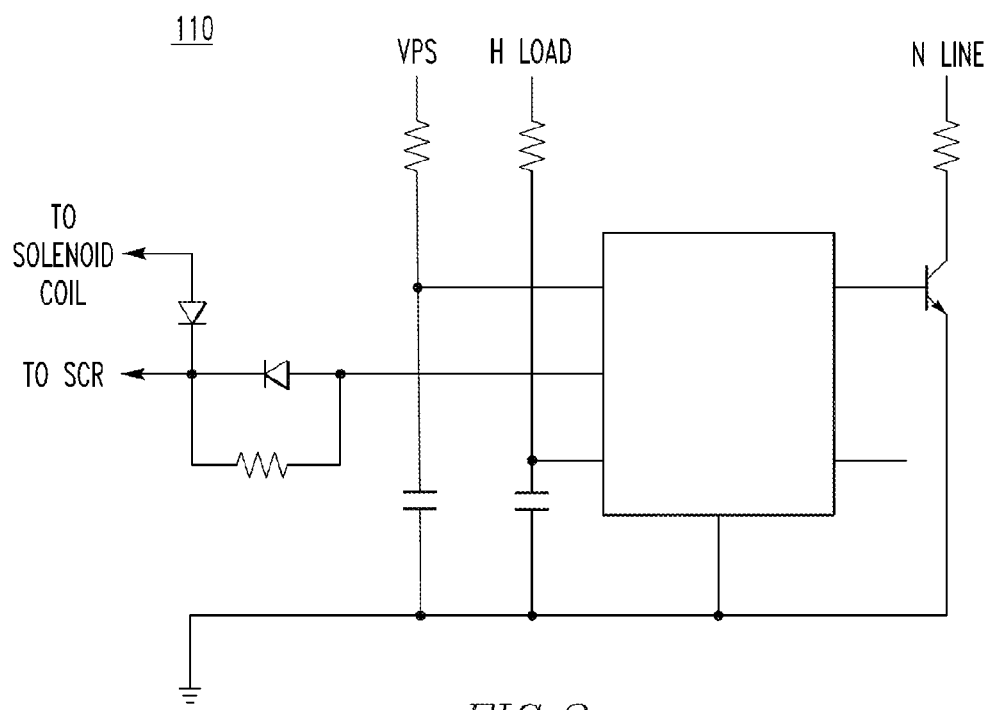
FIG. 2 is a circuit diagram of a GFCI monitor circuit.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Figure 3:
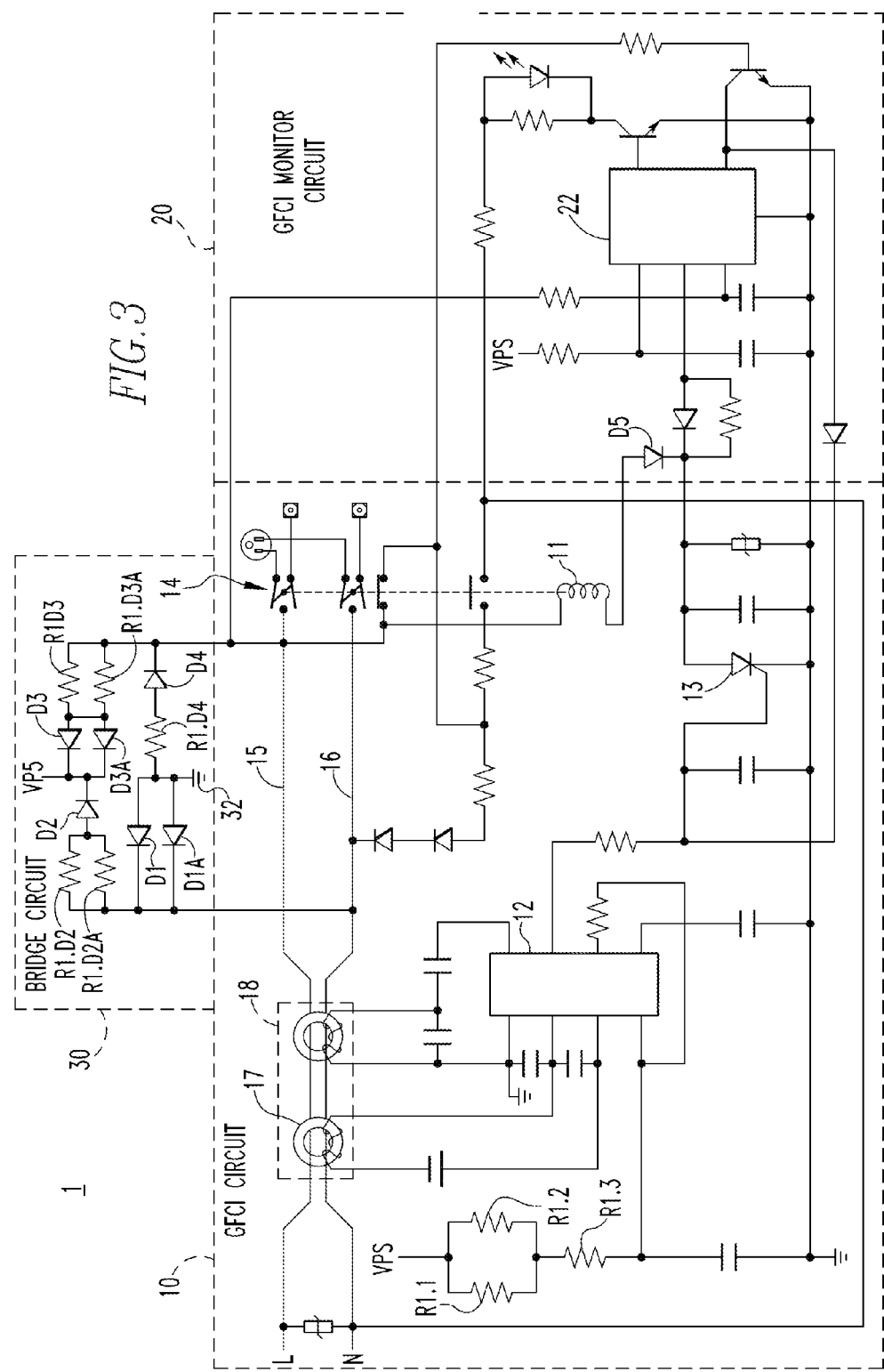
FIG. 3 is a circuit diagram of a self-test GFCI circuit in accordance with an example embodiment of the disclosed concept.

A circuit diagram of a self-test GFCI circuit 1 in accordance with an example embodiment of the disclosed concept is shown in FIG. 3. The self-test GFCI circuit 1 may be included in a circuit interrupter (e.g., without limitation, a GFCI). The self-test GFCI circuit 1 includes a GFCI circuit 10, a GFCI monitor circuit 20, and a bridge circuit 30.

The GFCI circuit 10 is a circuit that is structured to detect when a ground fault occurs on a protected circuit based on current flowing through line and neutral conductors 15,16. The GFCI circuit 10 initiates a trip to cause separable contacts 14 to trip open when a ground fault is detected. The GFCI circuit 10 includes sensing transformers 18 to sense the current flowing through the line and neutral conductors 15,16 and an integrated circuit (IC) GFCI chip 12 to determine whether a ground fault has occurred. The IC GFCI chip 12 may be any suitable IC GFCI chip such as, without limitation, a Fairchild KA2807D IC or a Fairchild LM1851 IC (both marketed by Fairchild Semiconductor Corporation of San Jose Calif.).

The GFCI monitor circuit 20 is a circuit that is structured to perform a self-test on the GFCI to determine the functional status of the GFCI circuit 10 (e.g., whether it is operational or not). The GFCI monitor circuit 20 includes an IC GFCI monitor chip 22. The IC GFCI monitor chip 22 may be any suitable IC GFCI monitor chip such as, without limitation, a Fairchild FAN41501 IC (marketed by Fairchild Semiconductor Corporation of San Jose Calif.). The IC GFCI monitor chip 22 has two non-user programmable internal timers set at 1 second and 90 minutes. The IC GFCI monitor chip 22 periodically initiates a self-test to determine the functional status of the GFCI circuit 10, and in particular, the functional status of the IC GFCI chip 12 as well as a solenoid 11, a sense coil 17, and a silicon controlled rectifier (SCR) 13 included in the GFCI circuit 10.

The GFCI monitor circuit 20 includes a diode D5 disposed between an anode of the SCR 13 and the solenoid 11. The GFCI monitor circuit 20 generates a ground fault current pulse during a self-test cycle. The ground fault current pulse is generated at 170° of the positive cycle preceding the negative cycle of the line in which the self-test will be performed. The ground fault current pulse lasts less than 4 ms. When the GFCI circuit 10 is working properly, it will detect the ground fault current pulse generated by the GFCI monitor circuit 20 and output a signal to activate the SCR 13. Diode D5 will be reverse biased during the negative cycle when the simulated ground fault current pulse occurs. Thus, the solenoid 11 will be isolated and will not cause the separable contacts to trip open during the self-test, even though the SCR 13 is activated.

During the positive cycle of the line, the IC GFCI monitor chip 22 will sense voltage across the SCR 13, and if it is above a predetermined threshold, it means that the solenoid 11 is working properly and that the SCR 13 is not activated. The IC GFCI monitor chip 22 will latch the positive result. If the GFCI circuit 10 is working properly, the IC GFCI monitor chip 22 will detect that the IC GFCI chip 12, the sense coil 17, and the SCR 13 are working, latch the negative cycle result, and start the timer for the next self-test.

If the IC GFCI monitor chip 22 does not sense voltage across the SCR 13 during the positive cycle or detects that the SCR 13 does not turn on during the negative cycle, it determines that the GFCI circuit 10 is not working properly. The IC GFCI monitor chip 22 will repeat the self-test cycle four times. If the GFCI circuit 10 continues to fail, the IC GFCI monitor chip 22 will output an end-of-life signal to trigger the SCR 13 to cause separable contacts 14 to trip open.

The bridge circuit 30 is structured to supply power to the GFCI circuit 10 and the GFCI monitor circuit 20. The bridge circuit 30 supplies power to the GFCI circuit 10 and the GFCI monitor circuit 20 via a supply point VPS. The bridge circuit 30 obtains power by harvesting it from current flowing on the line and neutral conductors 15,16.

The bridge circuit 30 includes diodes D1, D2, D3, and D4. Diodes D1, D2, D3, and D4 perform a bridge rectifier function to rectify power harvested from the line and neutral conductors 15,16 and provide it to the GFCI circuit 10 and the GFCI monitor circuit 20. Diode D1 is electrically connected between the neutral conductor 16 and a ground point 32. Diode D2 is electrically connected between the neutral conductor 16 and the supply point VPS. Diode D3 is electrically connected between the line conductor 15 and the supply point VPS. Diode D4 is electrically connected between the line conductor 15 and the ground point 32.

The bridge circuit 30 further includes redundant diodes D1A and D3A. Redundant diodes D1A and D3A allow the bridge circuit 30 to continue providing power even if diodes D1 and D3 fail. That is, redundant diode D1A will continued to provide power harvested from the line and neutral conductors 15,16 to the GFCI circuit 10 and the GFCI monitor circuit 20 via the supply point VPS even when diode D1 fails open (i.e., diode D1 fail to allow current to flow through them in either direction). Redundant diode D3A will continued to provide power harvested from the line and neutral conductors 15,16 to the GFCI circuit 10 and the GFCI monitor circuit 20 via the supply point VPS even when diode D3 fails open. Redundant diode D1A is electrically connected in parallel with diode D1 and redundant diode D3A is electrically connected in parallel with diode D3.

The bridge circuit 30 further includes current limiting resistors R1.D2, R1.D2A, R1.D3, and R1.D3A. Current limiting resistors R1.D2 and R1.D2A are electrically connected in parallel with each other and the parallel combination of current limiting resistors R1.D2 and R1.D2A is electrically connected in series with diode D2. Current limiting resistors R1.D3 and R1.D3A are electrically connected in parallel with each other and the parallel combination of current limiting resistors R1.D3 and R1.D3A is electrically connected between the line conductor 15 and diode D3. Current limiting resistors R1.D2, R1.D2A, R1.D3, and R1.D3A serve as current limiting resistors and allow the self-test GFCI circuit 1 to function even if a diode in the bridge circuit 30 becomes shorted.

The bridge circuit 30 further includes a fuse R1.D4 (e.g., without limitation, a fusible resistor or a fusible printed circuit board trace) electrically connected in series with diode D4. The fuse R1.D4 is structured to open in the event that either of diodes D1 and D4 become shorted.

The bridge circuit 30 is connected on the load side of sensing transformers 18 of the GFCI circuit 10. Connecting the bridge circuit 30 at the load side of the sensing transformers 18, rather than the line side, makes it easier for the IC GFCI monitor chip 22 to generate the simulated ground fault current signal.

A dropping resistor bank in the GFCI circuit 10 includes resistors R1.1, R1.2, and R1.3 Resistors R1.1 and R1.2 are electrically connected in parallel with each other. The parallel combination of resistors R1.1 and R1.2 is electrically connected in series with resistor R1.3. The dropping resistor bank is electrically connected to the supply point VPS. During the positive cycle (i.e., when the line hot voltage is positive with respect to the line neutral voltage), current flows through resistors R1.D3 and R1.D3A to the dropping resistor bank. During the negative cycle (i.e., when the line neutral voltage is positive with respect to the line hot voltage), current flows through resistors R1.D2 and R1.D2A to the dropping resistor bank. In some example embodiments of the disclosed concept, the dropping resistor bank has a total resistance value of 15Ω. The dropping resistor bank is configured to spread heat over a large area of a printed circuit board it is mounted on to pass the 240 $V_{AC}$ test in UL943. The dropping resistor bank also limits current in the event that diodes D2 and D3 ever fail shorted.

The self-test GFCI circuit 1 complies with the self-test requirements of UL943 and thus would allow GFCIs including such a circuit to comply with the self-test requirements of UL943.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:
1. A circuit interrupter comprising:
   a ground fault circuit interrupter circuit structured to detect a ground fault based on current flowing in line and neutral conductors of the circuit interrupter;

a ground fault circuit interrupter monitor circuit structured to perform a self-test on the circuit interrupter to determine the functional status of the ground fault circuit interrupter; and
a bridge circuit structured to harvest power from the line and neutral conductors and supply said harvested power to the ground fault circuit interrupter circuit and the ground fault circuit interrupter monitor circuit;
wherein the bridge circuit further comprises:
a ground point;
a supply point electrically connected to the ground fault circuit interrupter circuit and the ground fault circuit interrupter monitor circuit, wherein the bridge circuit is structured to supply said harvested power to the ground fault circuit interrupter circuit and the ground fault circuit interrupter monitor circuit via the supply point;
a first diode electrically connected between the neutral conductor and the ground point;
a second diode electrically connected between the neutral conductor and the supply point;
a third diode electrically connected between the line conductor and the supply point; and
a fourth diode electrically connected between the line conductor and the ground point;
a first redundant diode electrically connected in parallel with the first diode and not electrically connected in parallel with any other diodes of the bridge circuit; and
a second redundant diode electrically connected in parallel with the third diode and not electrically connected in parallel with any other diodes of the bridge circuit.

2. The circuit interrupter of claim 1, wherein the bridge circuit is electrically connected to the line and neutral conductors on a load side of the ground fault circuit interrupter circuit.

3. The circuit interrupter of claim 1, wherein the bridge circuit is structured to provide said harvested power to the ground fault circuit interrupter circuit and the ground fault circuit interrupter monitor circuit via the first redundant diode when the first diode fails.

4. The circuit interrupter of claim 1, wherein the bridge circuit is structured to provide said harvested power to the ground fault circuit interrupter circuit and the ground fault circuit interrupter monitor circuit via the second redundant diode when the third diode fails.

5. The circuit interrupter of claim 1, wherein the bridge circuit further comprises:
a first current limiting resistor;
a second current limiting resistor electrically connected in parallel with the first current limiting resistor,
wherein a parallel combination of the first and second current limiting resistors is electrically connected in series with the second diode.

6. The circuit interrupter of claim 1, wherein the bridge circuit further comprises:
a third current limiting resistor;
a fourth current limiting resistor electrically connected in parallel with the third current limiting resistor,
wherein a parallel combination of the third and fourth current limiting resistors is electrically connected between line conductor and the third diode.

7. The circuit interrupter of claim 1, wherein the bridge circuit further comprises:
a fuse electrically connected in series with the fourth diode.

8. The circuit interrupter of claim 7, wherein the fuse is one of a fusible resistor and a fusible printed circuit board trace.

9. The circuit interrupter of claim 1, wherein the ground fault circuit interrupter circuit further comprises:
a dropping resistor bank structured to receive the harvested power from the bridge circuit, the dropping resistor bank comprising:
a first resistor;
a second resistor electrically connected in parallel with the first resistor; and
a third resistor electrically connected in series with a parallel combination of the first and second resistors.

10. The circuit interrupter of claim 1, wherein the ground fault circuit interrupter circuit further comprises:
sensing transformers structured to sense the current flowing in the line and neutral conductors; and
an integrated circuit structured to determine whether a ground fault has occurred.

11. The circuit interrupter of claim 10, wherein ground fault circuit interrupter monitor circuit is structured to determine the functional status of the integrated circuit.

12. The circuit interrupter of claim 1, wherein the ground fault circuit interrupter circuit further comprises:
a solenoid;
a sense coil; and
a silicon controlled rectifier,
wherein the ground fault circuit interrupter monitor circuit is structured to determine the functional status of the solenoid, the sense coil, and the silicon controlled rectifier.

13. The circuit interrupter of claim 1, wherein the ground fault circuit interrupter monitor circuit is structured to periodically perform the self-test on the circuit interrupter.

* * * * *